(12) United States Patent
Berkram et al.

(10) Patent No.: US 9,300,304 B2
(45) Date of Patent: Mar. 29, 2016

(54) SELF-BIASED DELAY LOCKED LOOP WITH DELAY LINEARIZATION

(75) Inventors: Daniel A. Berkram, Loveland, CO (US); Zhubiao Zhu, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 9 days.

(21) Appl. No.: 14/387,618

(22) PCT Filed: Apr. 26, 2012

(86) PCT No.: PCT/US2012/035095
§ 371 (c)(1),
(2), (4) Date: Sep. 24, 2014

(87) PCT Pub. No.: WO2013/162557
PCT Pub. Date: Oct. 31, 2013

(65) Prior Publication Data
US 2015/0054555 A1    Feb. 26, 2015

(51) Int. Cl.
*H03L 7/00*   (2006.01)
*H03L 7/091*  (2006.01)
*H03L 7/081*  (2006.01)
(Continued)

(52) U.S. Cl.
CPC .............. *H03L 7/091* (2013.01); *H03L 7/0812* (2013.01); *H03L 7/093* (2013.01); *H03L 7/1075* (2013.01); *H03K 5/135* (2013.01); *H03L 2207/04* (2013.01)

(58) Field of Classification Search
CPC ....... H03K 5/131; H03K 5/133; H03K 5/134; H03K 5/135; H03K 5/14; H03K 2005/00019; H03K 2005/00026; H03K 2005/00058; H03L 7/0814; H03L 7/0818

USPC ......... 327/149, 158, 161, 261, 262, 276, 277, 327/284, 590

See application file for complete search history.

(56) References Cited

U.S. PATENT DOCUMENTS 6,844,766 B2   1/2005  Sun
6,993,105 B1   1/2006  Little et al.
(Continued)

OTHER PUBLICATIONS

International Searching Authority, The International Search Report and the Written Opinion, Dec. 26, 2012, 9 Pages.
(Continued)

*Primary Examiner* — William Hernandez
(74) *Attorney, Agent, or Firm* — Brooks Cameron & Huesbch, PLLC

(57) ABSTRACT

Apparatuses and methods for a self-biased delay looked loop with delay linearization are provided. One example delay locked loop (DLL) circuit (100, 200) can include a digital-to-analog converter (DAC) (104, 204, 304) and a bias generator (108, 208) communicatively coupled to an output of the DAC (106, 206, 306). The bias generator (108, 208) is configured to provide a clock signal and a bias signal. A delay control circuit (DCC) (109, 209) is communicatively coupled to the bias generator (108, 208). The DCC (109, 209) is configured to provide a delayed clock signal based on the clock signal and the bias signal. A DAC bias circuit (122, 222, 422) is communicatively coupled to the DAC (106, 206, 306) and configured to provide a feedback signal to the DAC (104, 204, 304) based on the bias signal. The DAC bias circuit (122, 222, 422) is configured to adjust the feedback signal to cause the delayed clock signal at the output of the DAC (106, 206, 306) to be non-linear to counteract non-linear delay characteristics of the DCC (109, 209).

15 Claims, 4 Drawing Sheets

(51) Int. Cl.
  *H03L 7/093* (2006.01)
  *H03L 7/107* (2006.01)
  *H03K 5/135* (2006.01)

(56) References Cited

U.S. PATENT DOCUMENTS

| | | |
|---|---|---|
| 6,998,897 B2 | 2/2006 | Pilo et al. |
| 7,071,745 B2 | 7/2006 | Heightley et al. |
| 7,535,273 B2 | 5/2009 | Suda |
| 7,634,039 B2 | 12/2009 | Maneatis et al. |
| 2002/0041196 A1 | 4/2002 | Demone et al. |
| 2009/0146705 A1 | 6/2009 | Huang |
| 2009/0153214 A1 | 6/2009 | Takatori |
| 2010/0019795 A1* | 1/2010 | Suda .................. G01R 31/3016 324/754.07 |
| 2010/0156488 A1 | 6/2010 | Kim et al. |
| 2011/0234308 A1 | 9/2011 | Vlasenko |
| 2011/0267120 A1 | 11/2011 | Ravi et al. |

OTHER PUBLICATIONS

Moazedi, M. et al., A Low-power Multiphase-delay-locked-loop with a Self-Biased Charge Pump and Wide-range Linear Delay Element, (Research Paper), Cyber Journals: Multidisciplinary Journals in Science and Technology, Journal of Selected Areas in Microelectronics (JSAM), Apr. 10, 2011, 8 Pages.

Luo, G et al., An Improved Voltage-controlled Delay Line for Delay Locked Loops, (Research Paper), 2011 3rd International Conference on Computer Research and Development (ICCRD), Mar. 11-13, 2011, pp. 237-240, vol. 2.

* cited by examiner

SELF-BIASED DELAY LOCKED LOOP WITH DELAY LINEARIZATION

BACKGROUND

In various applications, it can be useful to delay the transmission of an electrical signal. For example, such delayed transmissions can be used to synchronize signals for various circuits, including clock signals. Such signal synchronization allows integrated circuits to work properly. The transmission of an electrical signal can be delayed in various ways, including by use of a delay line. It is beneficial with respect to circuit operations, for delay to be linear so that control resolution is uniform. Certain previous approaches for implementing a delay line caused the delay line to exhibit non-linear delays.

DETAILED DESCRIPTION

Figure 1:
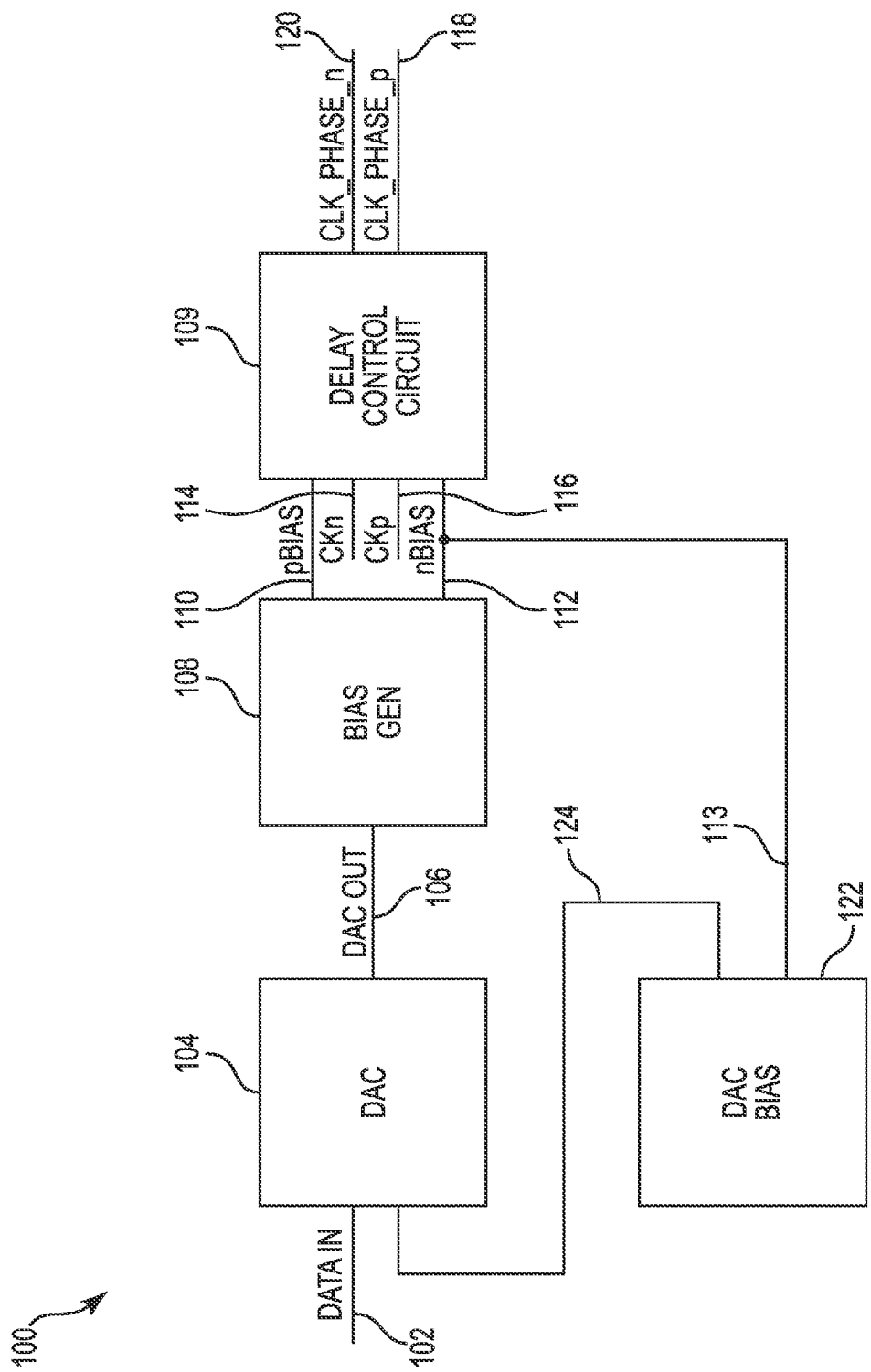
FIG. 1 is a block diagram illustrating a self-biased delay locked loop with delay linearization in accordance with one or more embodiments of the present disclosure.

Apparatuses and methods for a self-biased delay locked loop with delay linearization are provided. One example delay locked loop (DLL) circuit can include a digital-to-analog converter (DAC) and a bias generator communicatively coupled to an output of the DAC. The bias generator is configured to provide a clock signal and a bias signal. A delay control circuit (DCC) is communicatively coupled to the bias generator. The DCC is configured to provide a delayed clock signal based on the clock signal and the bias signal. A DAC bias circuit is communicatively coupled to the DAC and configured to provide a feedback signal to the DAC based on the bias signal. The DAC bias circuit is configured to adjust the feedback signal to cause the delayed clock signal at the output of the DAC to be non-linear to counteract non-linear delay characteristics of the DCC.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

The terms "first," "second," "third," and "fourth" may be used herein, and/or in the claims, merely for convenience in differentiating the nomenclature of various features from one another. The use of such terms does not necessarily imply that the materials are of different composition, but sometimes are used to distinguish between materials formed at different elevations, at different times, or in different manners, even if of the same composition. The use of such terms does not intend to convey a particular ordering of the features, including, but not limited to, an order of forming.

A delay element (DE) is an electrical element that can delay the transmission of an electrical signal, e.g., delay gate. A DE can receive a signal and then, after a time delay, generate a delayed signal. The delayed signal generated by the DE can have the same properties as the signal received by the DE, except that the delayed signal can have the time delay added by the DE. A particular DE can have a time delay that is a fixed amount of time, however different DEs can have different time delays.

A delay line (DL) is an electrical component that can delay the transmission of an electrical signal by using one or more DEs connected together in a line of DEs, e.g., in series. A DL can receive a signal and then, after a time delay, generate a delayed signal. A particular DL can have time delays for varied amounts of time. The time delay of a DL can be varied by tapping the DL after one or more DEs used by the DL. In this manner, a DL can provide a plurality of time delays. A DL may include a number (N) DEs to produces N phases of a reference clock signal (a signal with a periodic waveform). A DL can use none of the DEs in a DL to generate a signal with a time delay of zero, for example.

A Delay Control Circuit (DCC) can include one or more DLs. A particular DCC can provide time delays for varied amounts of time.

A delay locked loop (DLL) can be used for clock alignment in electronic systems. A DLL can be part of a chip, such as being part of a high-speed interface on a chip, between chips, across a backplane, or part of some other computing system arrangement.

A DLL can be used to charge the phase of a clock signal used in integrated circuits such as memory devices, e.g., dynamic random access memory (DRAM) devices. Alignment can occur by delaying an input clock signal by certain amount(s), such as by increments of a full clock cycle. A DLL is a circuit similar to a phased locked loop (PLL), with a principal difference being a delay line used in place of an internal voltage-controlled oscillator. DLLs can also be used for clock and data recovery circuits (CDR). A DLL can include a DCC, which can have one or more DLs composed of one or more DEs. The input of the DLL can be the clock signal that is to be delayed. The output of the DLL can be the resulting delayed clock signal.

A DLL can include a Voltage-Controlled Delay Line (VCDL). In a DLL, variation of the loop gain can be caused by variation in VCDL gain, thus causing the loop bandwidth of the DLL to vary from the design target. The variations in the VCDL gain can result from VCDL nonlinear delay characteristics. Thus, it is important that the VCDL have a linear delay characteristic over the full range of the control voltage. It is also desirable for a VCDL to have good duty cycle correction.

FIG. 1 is a block diagram illustrating a self-biased delay locked loop with delay linearization in accordance with one or more embodiments of the present disclosure. FIG. 1 shows a DLL 100 that includes a digital-to-analog converter (DAC) 104 communicatively coupled to a bias generator 108. The bias generator 108 is communicatively coupled to a delay control circuit (DCC) 109. The outputs of the DLL 100 are the outputs of the DCC 109. A DAC bias feedback circuit 122 is communicatively coupled between an output of the bias generator 108 and the DAC 104. That is, the DAC bias feedback circuit 122 monitors a signal output from the bias generator 108, e.g., the inverted bias signal 112 via feedback path 113, and provides a DAC bias signal to the DAC 104 via feedback path 124. The DAC bias feedback circuit 122 is discussed further with respect to FIG. 2.

A data input 102 (of the DLL 100) is connected to the DAC 104. A DAC output 106 of the DAC 104 is connected to the bias generator 108. The DAC 104 is configured to convert digital input data on the data input 102 to an analog output signal on the DAC output 106. The DAC 104 is discussed further with respect to FIGS. 2 and 3.

The bias generator 108 receives as an input, the analog output of the DAC 104. The bias generator 108 is configured to provide a number of outputs, including one or more bias signals. According to various embodiments, the bias signals can include a pBIAS signal 110 and an nBIAS signal 112. The pBIAS signal 110 can be used for biasing pFETs (p-channel field effect transistor) of the DCC, and the nBIAS signal 112 can be used for biasing nFETs (n-channel field effect transistor) of the DCC. The bias generator 108 is discussed further with respect to FIGS. 2 and 4.

The DCC 109 receives as inputs, clock signals and the bias signals from the bias generator 108. According to some embodiments, the clock signals can be a differential clock signal including a positive, i.e., non-inverted, clock signal 116 and a negative, i.e., inverted, clock signal 114. The negative clock signal 114 can be an inverted version of the positive clock signal 116. The DCC 109 can be connected to the bias generator 108 by a pBIAS signal 110 path and an nBIAS signal 112 path. The output of the DCC 109 is the delayed clock signal, which can be a differential delayed clock signal. The differential delayed clock signal can include a positive, i.e., non-inverted, delayed clock signal 118 (CLK_PHASE_p) and a negative, i.e., inverted, clock signal 120 (CLK_PHASE_n), among other output signals (discussed with respect to FIG. 2).

The DCC 109 can include a number (N) of DEs, which can delay the transmission of the input clock signal(s) 114 and 116 by one or more time delays. The DCC 109 can receive the positive 116 and negative 114 input clock signals and then, after some time delay, generate the positive 118 and negative 120 delayed clock signals. The delayed clock signals 118 and 120 can have the same properties as the input clock signals 114 and 116, except that the delayed clock signals 118 and 120 can have the time delay added by the zero or more DEs.

The DCC can have non-linear delay characteristics. For example, the DCC can produce a shorter delay for higher magnitude input control signals, e.g., bias signals. That is, a DL within the DCC can speed up at higher control signal voltages resulting in a non-linear delay for the output clock signals 118 and 120 with respect to the input clock signal(s) 114 and 116.

One way to counteract the non-linearity of the DCC is to provide different voltage changes in bias signals input to the DCC at higher voltage magnitudes of the bias signals in order to obtain a same delay that occurs for particular voltage changes in bias signals input to the DCC at lower voltage magnitudes of the bias signals. That is, a first change in the bias signals at a first voltage magnitude of the bias signals causes the DCC to produce a first amount of delay.

By adjusting a second change in the bias signals at a second voltage magnitude of the bias signals to be different than the first change in the bias signals, by an amount that counteracts the non-linear change in amount of delay produced by the DCC at the second voltage magnitude of the bias signals, the DCC can be controlled to provide a same amount of delay, e.g., first amount of delay, for the second change in the bias signals at a second voltage magnitude of the bias signals as was provided by the DCC for first change in the bias signals at a first voltage magnitude of the bias signals. That is, the bias signals are adjusted to be non-linear in an inversely proportional manner to counteract the non-linearity characteristics of the DCC such that in combination, linear performance is obtained for the DLL.

The feedback of the nBIAS signal 112 through the DAC bias feedback circuit 122 provides the DAC with indication of the magnitude of the nBIAS signal 112 magnitude. The DAC bias circuit can be configured to adjust the feedback signal to cause the output of the DAC to change voltage based on the magnitude of the nBIAS signal 112 magnitude. For example, the DAC bias circuit can be configured to form the feedback signal to the DAC by adding a dynamic bias signal based on the nBIAS signal 112 provided from the bias generator 108 to the DCC to a static bias signal. The DCC 109, and its non-linear characteristics, is discussed further with respect to FIG. 2.

Figure 2:
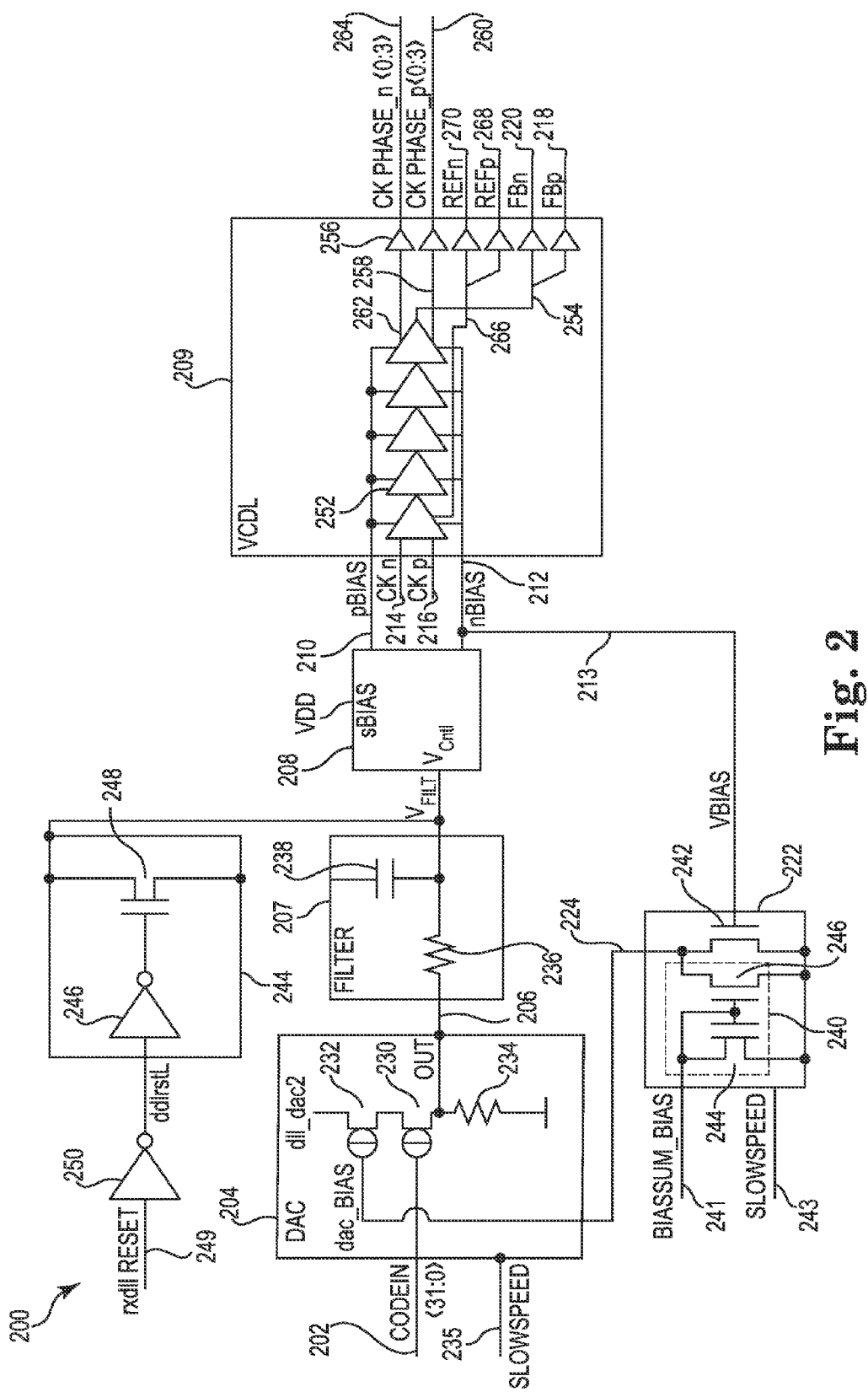
FIG. 2 is a block diagram illustrating in more detail a self-biased delay locked loop with delay linearization in accordance with one or more embodiments of the present disclosure.

FIG. 2 is a block diagram illustrating in more detail a self-biased delay locked loop with delay linearization in accordance with one or more embodiments of the present disclosure. FIG. 2 shows an example DLL 200 of the present disclosure in more detail than the DLL 100 shown in FIG. 1. DLL 200 includes a DAC 204 communicatively coupled to a bias generator 208 ("sBIAS") through a filter 207. The bias generator 206 is communicatively coupled to the DCC 209. DCC 209 can be implemented as a voltage-controlled delay line (VCDL). The outputs of the DLL 200 include a number of outputs from the DCC 209 (discussed in detail below). A DAC bias feedback circuit 222 is communicatively coupled between a bias output of the bias generator 208 and the DAC 204. Self-biasing of the DLL refers to this feedback loop which monitors biasing of the VCDL and provides feedback to adjust same (as discussed further below).

The input to the DAC 204 is a data input 202. The data input 202 is shown in FIG. 2 receiving a 32 bit digital input signal (CODEIN <31:0>). However, embodiments are not so limited and embodiments of the present disclosure can be implemented with other digital data sizes.

A simplified representation of the operation of DAC 204 is shown in FIG. 2. The digital input signal is applied to the gates of DAC transistors 230, e.g., arranged in parallel, which controls the current allowed to flow from a source, e.g., dll_BIAS2, through resistance 234. The amount of current flowing through resistance 234 produces a proportional voltage across resistance 234.

The amount of current that flows across resistance 234 is controlled by how many of the parallel DAC transistors 230 are turned on by corresponding bits of the digital input signal, as well as the operating condition of DAC bias transistor 232. DAC bias transistor 232 is modulated by a bias signal from the DAC bias circuit 222 to throttle the current flow from source dll_BIAS2 through respective DAC transistors 230 which in aggregate then flows through resistance 234. As such, the voltage magnitude of the DAC output signal 206 is determined by the state of the digital input signal, as modified by the bias signal 224.

The DAC 204 can also receive a "SLOWSPEED" input signal 235, which can be used to alter operation for the DAC 204. The SLOWSPEED mode can be used, for example, to provide additional frequency range capability. More particularly, the SLOWSPEED mode can support slower clock frequencies. When enabled, the SLOWSPEED mode can modify all of the bias voltages to provide another "band" of operating frequencies with similar resolution to the higher frequency band of operation.

The DAC output signal 206 is communicatively coupled to filter 207. According to various embodiments of the present disclosure, filter 207 is a low-pass filter, represented for simplicity in FIG. 2 as comprising an RC filter comprising a series resistance 236 and a shunting capacitance 238. However, embodiments of the present disclosure are not so limited, and filter 207 can be implemented in other configurations to provide low-pass signal filtering characteristics intended to mitigate high frequency noise aspects of the analog signal generated by the DAC 204, thereby smoothing out the DAC output signal 206. Furthermore, DLL 200 can be implemented with or without filter 207, or with different filtering of the DAC analog output signal. The output of the low pass filter is shown in FIG. 2 having signal $V_{FILT}$, which is connected as the input of the bias generator 208.

According to some embodiments, filter 207 is a low pass filter having a bandwidth feedthrough that is higher than the DLL compensation bandwidth. That is, the bandwidth of filter 207 is set high enough so that the filtering characteristics do not interfere with the overall compensation of the DLL loop. For simplicity, FIG. 2 does not show actual accumulator compensation capacitance for the DLL itself.

Optional reset logic is shown in the upper-left portion of FIG. 2. A reset input 249 is connected to inverting buffer 250. The output of inverting buffer 250 is connected to inverting buffer 246, and the output of inverting buffer 246 is connected to the gate of transistor 248. Buffers 250 and/or 246 can be configured to condition the signals presented at their respective inputs, for example. A receiver DLL reset signal (rxdll RESET) signal can be communicated on reset input 249 through inverting buffer 250 to produce an intermediate inverted reset signal (ddlrstL), which is inverted again and applied to control reset transistor 248. Reset transistor 248 can be arranged and configured to pull $V_{FILT}$ to a predetermined value, e.g., high or low, that can operate to reset downstream components and/or signals.

The bias generator 208 generates one or more bias signals from the analog signal $V_{FILT}$, received as an input. As such, bias generator 208 is labeled "sBIAS," e.g., signal bias, in FIG. 2. Power for bias generator 208 can be drawn from Vdd, as shown. The bias generator 208 is shown in FIG. 2 generating and providing a pBIAS signal 210 and an nBIAS signal 212. The pBIAS signal 210 can be used for biasing pFETs of the DCC, and the nBIAS signal 212 can be used for biasing nFETs of the DCC. The bias generator 208 can be used to provide power supply isolation for the VCDL (and the outputs thereof).

FIG. 2 shows a simplified depiction of the VCDL, with positive 216 and negative 214 clock signals being input to a DL having a number of stages 252. FIG. 2 shows the DL having 5 stages. The first stage can be a signal conditioning stage, and the last four stages can be DEs, each delaying the clock signals by some portion of a cycle, e.g., one quarter. However, embodiments of the present disclosure are not limited to a particular number of DE stages, and can be implemented with fewer or more DE stages. For example, the DL can be implemented with one conditioning stage and a number of DEs to provide ⅛ cycle delay increments. The pBIAS signal 210 and the nBIAS signal 212 are shown in FIG. 2 being connected to each stage to provide pFET and nFET bias signals thereto.

FIG. 2 shows the VCDL having a number of outputs, including a plurality of differential delayed clock signals, a differential reference clock signal, and a differential feedback clock signal. Respective buffers 256 can be used to isolate various stage output signals from the VCDL output signals, i.e., the DLL output signals.

An output 266 from the first stage of the DL, e.g., the conditioning stage, drives the positive 268 (REFp) and negative 270 (REFn) reference clock signals. Reference clock signals 268 and 270 correspond to the input signals to the DEs. An output 254 from the last stage of the DL, e.g., the final DE stage, drives the positive 218 (FBp) and negative 220 (FBn) feedback clock signals. Feedback clock signals 218 and 220 correspond to the output signals of the DEs. The feedback clock signals 218 and 220 can be compared (not shown in FIG. 2) to the reference clock signals 268 and 270, which should be in-phase with one another. Adjustment action can be made based the results of this comparison.

FIG. 2 shows four differential delayed clock signals comprising four positive 260 (CK PHASE_p<0:3>) and four negative 264 (CK PHASE_p<0:3>) delayed clock signals, for a total of eight clock outputs. The four positive 260 and four negative 264 delayed clock signals represent the period of the input clock signal divided by 8, to provide a delayed clock output based on the input clock signal delayed one eighth of a cycle, e.g., ⅛ cycle delayed, ¼ cycle delayed, ⅜ cycle delayed, ½ cycle delayed, ⅝ cycle delayed, ¾ cycle delayed, ⅞ cycle delayed, and 1 cycle delayed.

These respective delayed clock signals can be used for a number of purposes in various computing and communication applications (not shown in FIG. 2), including but not limited to XORing clock phases together to generate higher frequency clock signal, etc. Although four particular delayed clock signals are illustrated being derived in FIG. 2, embodiments of the present disclosure are not so limited. The VCDL can be configured to derive more, fewer, and/or different delays than that shown being derived in FIG. 2. Also, the delayed clock signals can be differential, i.e., two inverse clock signals, or non-differential, i.e., a single clock signal.

Figure 3:
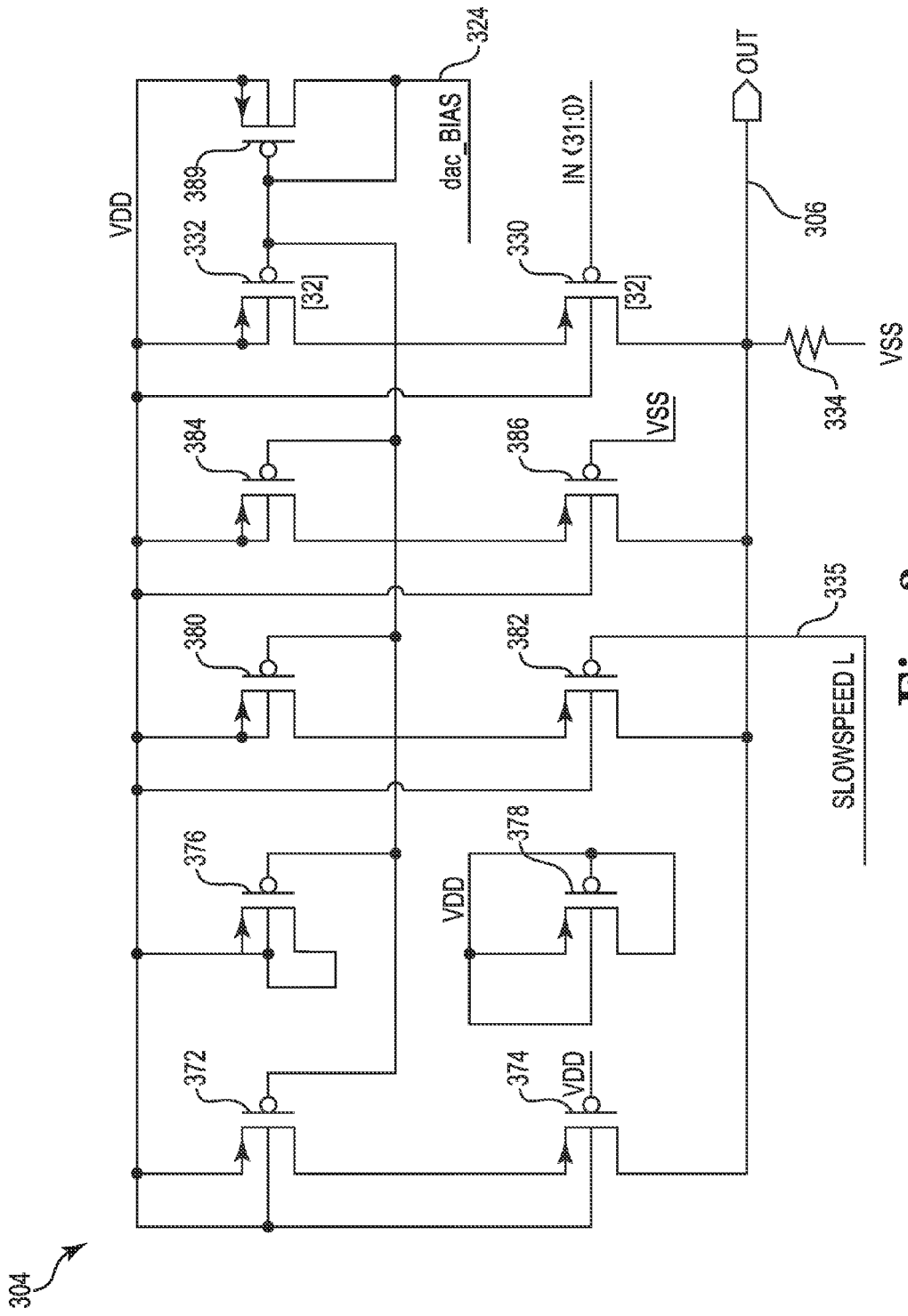
FIG. 3 is a block diagram illustrating a digital-to-analog converter (DAC) portion of a self-biased delay locked loop with delay linearization in accordance with one or more embodiments of the present disclosure.

FIG. 3 is a block diagram illustrating a digital-to-analog converter (DAC) portion of a self-biased delay locked loop with delay linearization in accordance with one or more embodiments of the present disclosure. The incoming feedback signal 324 (dac_BIAS) is shown being connected to the gate of transistor 389. Incoming feedback signal 324 is a dynamic bias signal, not a static bias signal. Providing dynamic feedback to the DAC in order to make it operate in a non-linear manner is different from previous DLL approaches. As can be appreciated from FIG. 1 (at 124) and FIG. 2 (at 224), the feedback signal into the DAC is based on the nBIAS signal provided by the bias generator to the VCDL. As such, the amount of feedback can vary. Embodiments of the present disclosure are not limited to the feedback being derived from the nBIAS signal, and circuits implementing the present disclosure can utilize feedback based on more and/or different control signals to the DCC.

As previously mentioned, the non-linearity of the DCC can be counteracted ahead of the DCC, by providing different voltage changes in bias signals input to the DCC at higher voltage magnitudes of the bias signals. This compensating non-linearity can be accomplished using the DAC 204 by adjusting the dac_BIAS signal. That is, if the DAC 204 received only a static bias current, the DAC 204 operates to turn-on more and more of the same amounts of current, and a linear step in the output voltage of the DAC 204 corresponding to different input DAC codes.

According to various embodiments, the dac_BIAS signal, used by DAC 204 as a reference current, is being modified to be a dynamic bias signal such that the stair steps of the DAC are no longer linear, e.g., the stair steps are each of a different magnitude. That is, the dac_BIAS signal is dynamically adjusted in a manner that causes non-linear operation of the DAC, e.g., stair step magnitudes, to be exactly inversely proportional to how fast the DLL delay line(s), e.g., DE stages 252 of the VCDL, speed-up with voltage. In this manner, an overall linear response is created for the DLL. The DAC can be controlled using non-linear control signals, the non-linearity opposing the non-linearity of the DAC. The non-linear control signal changes cause the DAC to respond in a non-linear fashion that is inverse, e.g., opposite, to the VCDL non-linearity so as to compensate for the non-linear characteristics of the VCDL, and provide a combined overall linear response of the DLL, i.e., the output of the DLL is linear with respect to the input to the DLL.

The dynamic portion of the dac_BIAS signal forces the DAC to be non-linear in its output to compensate for the non-linearity of the delay line in the VCDL. According to some embodiments, the dynamic portion of the dac_BIAS signal is based on the nBIAS signal to the VCDL. As the nBIAS signal rises, the dac_BIAS signal is adjusted to cause more current through the DAC, which results in bigger steps.

All transistors shown in FIG. 3 are pFETs. The pFET 332 is shown as being a single transistor; however, transistor 332 is implemented as a plurality of parallel-connected pFETs corresponding to the granularity of the digital-to-analog conversion. According to some embodiments, pFETs 332 and 330 are implemented as 32 parallel pFET pairs, e.g., connected drain-to-source as shown, providing 32 steps in the digital-to-analog conversion capability of the DAC. For simplicity, these parallel pFETs are referred to herein as the single pFET 332 shown in FIG. 3.

The pFETs 389 and 332 are arranged as a current mirror. The incoming signal dac_BIAS goes through pFET 332, which is a diode-connected pFET that generates a bias voltage. This bias voltage generated by pFET 332 is mirrored over to all the other upper pFETS. That is, incoming feedback signal 324 (dac_BIAS) is current mirrored by pFETs 389 and 332 to the gates of each of pFETs 372, 376, 380 and 384, as shown in FIG. 3.

The digital data input to the DAC, i.e., 102 shown in FIG. 1, is connected to the gate of pFET 330. Similar to pFET 332, pFET 330 represents as a plurality of parallel-connected pFETs corresponding to the granularity of the digital-to-analog conversion. That is, each pFET 332 is connected in series with a pFET 330 to provide a current path to resistance 334. According to some embodiments, pFET 330 is implemented as 32 parallel-connected pFETs (providing 32 steps in the digital-to-analog conversion capability of the DAC). For simplicity, these parallel pFETs are referred to herein as the single pFET 330 shown in FIG. 3. The pFET 330 operates as a switch that is controlled by a bit of the digital data input to allow more or less of the parallel stages of pFETS 332 and 330 to provide current to resistance 334. Switching on more of the parallel pFETS 330 causes more current to flow through resistance 334, which can cause more delay.

The output 306 of the DAC is the voltage taken at one end of resistance 334, e.g., across resistance 334 with respect to reference voltage Vss. Current, flowing through resistance 334 generates the voltage at output 306. More current flowing through resistance 334 generates a greater voltage output, and less current flowing through resistance 334 generates less voltage output. Some of the current flowing through resistance 334 is derived through pFETs 332 and 330. As more of pFETs 332 (and 330) are turned on, more current flows through resistance 334 and the voltage at output 306 increases.

The pair of pFETs 372 and 374, and the pair of pFETs 384 and 386, operate to provide a minimum current through resistance 334, even when all of pFETs 332 and 330 are turned-off. If no current were to flow through resistance 334, the undesirable condition of the voltage at output 306 is left floating. To avoid this possibility, the DAC is configured to always provide some minimum current flow through resistance 334 so as to force the output voltage to a minimum magnitude. The gate of pFET 374 is connected to the source Vdd, and the gate of pFET 386 is connected to the reference voltage Vss, as shown in FIG. 3. The pair of pFETs 372 and 374, and the pair of pFETs 384 and 386, can comprise a minimum current circuit.

The pFETs 380 and 382 comprise a slow speed portion of the DAC. A SLOWSPEED_L control signal is provided to the gate of pFET 382 via slow speed control signal path 335. The SLOWSPEED_L control signal can control an amount of additional current provided through pFETs 380 and 382 to resistance 334 during a slow speed mode. The slow speed mode can be used to provide additional frequency range capability, as discussed with respect to FIG. 2. The slow speed portion of the DAC can accomplish operational changes, for example, by changing a center point of the DAC operating range and/or extending the DAC operating range.

The pFETs 376 and 378 shown in FIG. 3 are dummies included in the DAC for layout purposes, for example. Their operation and function will not be discussed further here.

Figure 4:
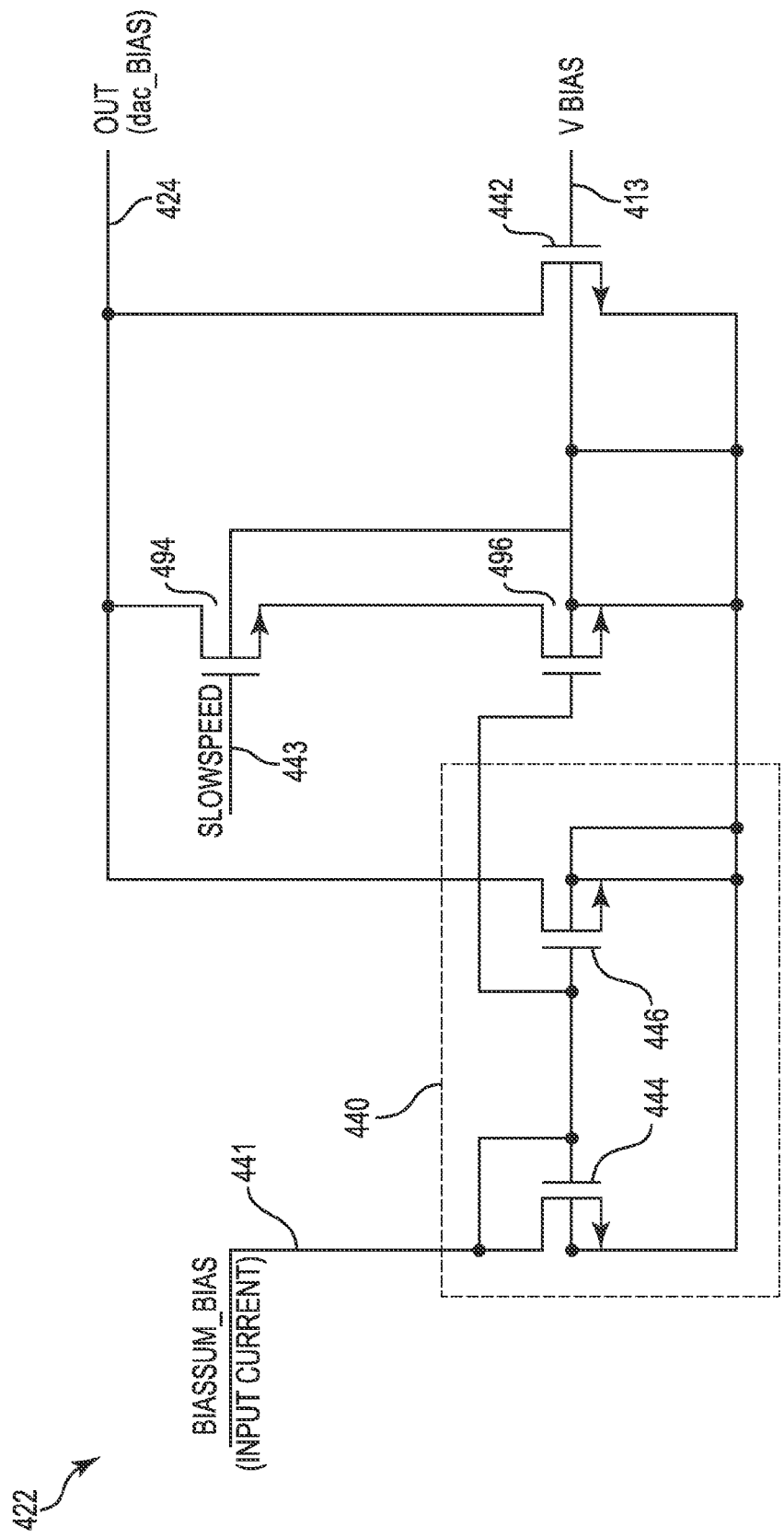
FIG. 4 is a block diagram illustrating a DAC bias circuit portion of a self-biased delay locked loop with delay linearization in accordance with one or more embodiments of the present disclosure.

FIG. 4 is a block diagram illustrating a DAC bias circuit portion of a self-biased delay locked loop with delay linearization in accordance with one or more embodiments of the present disclosure. The output signal 424 (dac_BIAS) is generated by the DAC bias circuit 422 and is the sum of two currents. One current is the direct current (DC) part, which is current mirrored from the input current 441 BIASSUM_BIAS, and the second current is controlled by the VBIAS signal.

The DAC bias circuit 422 receives as a current input 441 a static bias input current (BIASSUM_BIAS) and a dynamic voltage signal (V BIAS), derived from the nBIAS bias signal 112 generated by the bias generator 108 and provided to the DCC 109, as shown in FIG. 1. The static bias current and dynamic bias voltage are used to form an output bias signal (dac_BIAS), which is provided via the DAC bias circuit output 424 to the DAC (as shown in FIG. 1 at 124). The current input by which the static bias input current (BIASSUM_BIAS) is communicated to the DAC bias circuit 422 is omitted from FIG. 1 for simplicity.

All of the transistors shown in FIG. 4 are nFETs. The nFETs 444 and 446 comprise a current mirror. As such, the static bias input current 441 (BIASSUM_BIAS) is mirrored by nFETs 444 and 446 to the gate of nFET 496, as shown in FIG. 4.

The pFETs 494 and 496 comprise a slow speed portion of the DAC bias circuit 422. A SLOWSPEED control signal is provided to the gate of pFET 494 via slow speed control signal path 443. The SLOWSPEED control signal can change the response of the DAC bias circuit 422, e.g., adjust the value of the output bias signal (dac_BIAS), which is provided at output 424, in support of the slow speed mode (previously discussed).

Feedback path 413 is connected to the gate of nFET 442. As such, the dynamic voltage signal (V BIAS) operates to modulate nFET 442 to allow more or less current to flow through nFET 442, and in turn, output 424. An additional portion of current flowing through output 424 is driven by the current mirror, and more specifically, through nFET 446. Therefore, the current flowing through output 424 is proportional to the static bias input current (BIASSUM_BIAS) and a dynamic voltage signal (V BIAS).

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A delay locked loop (DLL) circuit, comprising:
 a digital-to-analog converter (DAC);
 a bias generator communicatively coupled to an output of the DAC and configured to provide a bias signal;
 a delay control circuit (DCC) communicatively coupled to the bias generator and configured to provide a delayed clock signal based on a clock signal and the bias signal; and
 a DAC bias circuit communicatively coupled to the DAC and configured to provide a feedback signal to the DAC based on the bias signal,
 wherein the DAC bias circuit is configured to adjust the feedback signal so as to cause the delayed clock signal at the output of the DAC to be non-linear to counteract non-linear delay characteristics of the DCC.

2. The DLL circuit of claim 1, wherein the DAC bias circuit is configured to provide the feedback signal that causes the bias signal to the DCC to be nonlinear in a manner that is inverse to the non-linear delay characteristics of the DCC such that the DCC response is linear throughout a voltage range of the clock signal.

3. The DLL circuit of claim 1, wherein the non-linear delay characteristics of the DCC include a delay of the DCC speeding up with increasing magnitude of the bias signal, and wherein the DAC bias circuit is configured to adjust the feedback signal to cause the change of the output voltage of the DAC to change based on the magnitude of the bias signal.

4. The DLL circuit of claim 3, wherein the DAC bias circuit is configured to provide a non-linear increase to a reference current comprising the feedback signal to the DAC at higher magnitudes of the bias signal, the reference current corresponding to an increment by which the delayed clock signal at the output of the DAC changes for a change in a digital input to the DAC (102, 202).

5. The DLL circuit of claim 4, wherein a non-linear increase to the reference current causes the delayed clock signal at the output of the DAC to have progressively larger voltage steps at progressively larger voltage magnitudes of the delayed clock signal at the output of the DAC, the progressively larger voltage steps causing the bias generator to provide progressively increasing magnitude for changes of the bias signal that offset the speeding up of the DCC delay with increasing magnitude of the bias signal.

6. The DLL circuit of claim 1, wherein the DAC bias circuit is configured to form the feedback signal by adding a dynamic bias signal to a static bias signal, the dynamic bias signal being based on a magnitude of the bias signal provided from the bias generator to the DCC.

7. The DLL circuit of claim 6, wherein the static bias signal is a reference current corresponding to one increment of the delayed clock signal change at the DAC output per digital signal change at an input to the DAC, and the dynamic bias signal is an adjustment to the magnitude of the one increment of analog signal change.

8. The DLL circuit of claim 1, further comprising a low pass filter communicatively coupled between the DAC and the bias generator, the low pass filter bandwidth being higher than a DCC compensation bandwidth.

9. A method for linearizing a delay of a delay locked loop (DLL), comprising:
 providing an output signal from a delay control circuit (DCC) of the DLL that includes a delay to an input signal, the delay being based on a magnitude of a bias signal;
 monitoring the magnitude of the bias signal; and
 providing non-linear changes to the bias signal based on the monitored magnitude of the bias signal,
 wherein the DCC has non-linear delay characteristics based on the magnitude of the bias signal, and the non-linear changes to the bias signal at a particular bias signal magnitude counteract the non-linear delay characteristics of the DCC at the particular bias signal magnitude.

10. A method of claim 9, wherein adjusting changes of the bias signal non-linearly includes increasing changes of the bias signal for higher voltage magnitudes of the bias signal.

11. A method of claim 10, wherein providing non-linear changes to the bias signal based on the monitored magnitude of the bias signal include providing a dynamic non-linear feedback current to a digital-to-analog converter (DAC) based on the monitored magnitude of the bias signal, the DAC configured to adjust the analog increment size of an output signal based on the dynamic non-linear feedback current, bias signal being based on the output signal of the DAC.

12. A method of claim 10, wherein providing non-linear changes to the bias signal includes changing of the bias signal for higher voltage magnitudes of the bias signal in an inverse manner so as to equivalently offset the non-linear delay characteristics of the DCC.

13. A delay locked loop (DLL) circuit, comprising:
a delay control circuit (DCC) configured to receive a clock signal and a bias signal, and provide a plurality of delayed clock signals based on the clock signal and the bias signal;
a bias generator configured to generate and provide the bias signal to the DCC based on an analog input signal;
a digital-to-analog converter (DAC) configured to generate the analog input signal having a magnitude of a reference signal multiplied by a quantity corresponding to a digital input signal; and
a DAC bias circuit configured to generate and provide to the DAC the reference signal having a static portion and a dynamic portion,
wherein the dynamic portion is non-linear based on magnitude of the bias signal and inverse in effect to non-linear delay characteristics of the DCC due to magnitude of the bias signal.

14. The delay locked loop circuit of claim 13, wherein the DAC includes:
a circuit portion configured to multiply an input reference current by a factor determined from an input digital circuit, and provide an output voltage signal proportional to the multiplied input reference current; and
a circuit portion configured to provide a minimum output voltage signal.

15. The delay locked loop circuit of claim 13, wherein the DAC bias circuit includes:
a current mirror circuit configured to mirror a static current input to an output of the DAC bias circuit; and
a voltage signal input having a voltage signal derived from the bias signal to the DCC,
wherein the DAC bias circuit is configured to add a dynamic current to the mirrored static current at the output, the dynamic current being based on the magnitude of the voltage signal derived from the bias signal to the DCC.

* * * * *